United States Patent
Wang et al.

(10) Patent No.: US 11,728,213 B2
(45) Date of Patent: Aug. 15, 2023

(54) METHOD OF COPPER PLATING FILLING

(71) Applicant: SHANGHAI HUALI INTEGRATED CIRCUIT CORPORATION, Shanghai (CN)

(72) Inventors: Junjie Wang, Shanghai (CN); Jianxun Chen, Shanghai (CN); Minchun Cai, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 203 days.

(21) Appl. No.: 16/900,701

(22) Filed: Jun. 12, 2020

(65) Prior Publication Data

US 2021/0057274 A1 Feb. 25, 2021

(30) Foreign Application Priority Data

Aug. 22, 2019 (CN) .......................... 201910777148.9

(51) Int. Cl.
*H01L 21/768* (2006.01)

(52) U.S. Cl.
CPC .. *H01L 21/76856* (2013.01); *H01L 21/76843* (2013.01); *H01L 21/76874* (2013.01); *H01L 21/7684* (2013.01)

(58) Field of Classification Search
CPC ......... H01L 21/76856; H01L 21/76843; H01L 21/76874; H01L 21/7684; H01L 21/76861; H01L 21/76873; H01L 21/76838; H01L 21/76879
See application file for complete search history.

(56) References Cited

U.S. PATENT DOCUMENTS 8,106,385 B2 * 1/2012 Ryuzaki ............ H01L 21/02126
257/E39.007

FOREIGN PATENT DOCUMENTS

| CN | 101989568 | * | 3/2011 |
| CN | 101989568 | A | 3/2011 |
| CN | 102044427 | * | 5/2011 |
| CN | 104465507 | A | 3/2015 |
| CN | 106158727 | * | 11/2016 |

OTHER PUBLICATIONS

1st Search Report for China Application No. 2019107771489 dated Mar. 18, 2021 (2 pages).

* cited by examiner

*Primary Examiner* — Thanhha S Pham
(74) *Attorney, Agent, or Firm* — Alston & Bird LLP

(57) ABSTRACT

The disclosure discloses a copper plating filling process method, comprising the steps of: forming a trench or a through-hole in a dielectric layer; forming a copper seed layer on an inner surface of the hole; allowing a waiting time after forming the copper seed layer and before performing a copper plating process, wherein during the waiting time, a surface of the copper seed layer is oxidized to form a copper oxide layer; performing a reduction process on the copper oxide layer; and filling a copper layer into the hole in the copper plating process afterwards. The copper oxide layer on the surface of the copper seed layer is reduced to copper in the reduction process, and wherein a thickness of the copper seed layers on the inner surface of the hole is uniform. The hole can be a trench or a through-hole.

17 Claims, 5 Drawing Sheets

METHOD OF COPPER PLATING FILLING

CROSS-REFERENCES TO RELATED APPLICATIONS

This application claims priority to Chinese patent application No. CN201910777148.9 filed on Aug. 22, 2019, and entitled "METHOD OF COPPER PLATING FILLING", the disclosure of which is incorporated herein by reference in entirety.

TECHNICAL FIELD

This application relates to manufacturing semiconductor integrated circuits, in particular to a process of copper plating and filling.

BACKGROUND

As shown in FIG. 1A to FIG. 1C, which show each step of a process in an existing copper plating filling. The process includes the following steps:

In step 1, as shown in FIG. 1A, a trench or through-hole 102 is formed on an interlayer film 101. The reference numeral 201 in FIG. 1A corresponds to a metal wiring formed in a previous interlayer film.

Generally, a hole, which can be a trench or a through-hole 102 is formed in the interlayer film 101.

The trench or through-hole 102 is formed by using a photolithographic definition plus etching process.

The etching process for forming the trench or through-hole 102 is often dry etching.

In step 2, as shown in FIG. 1B, a copper diffusion barrier layer 103 and a copper seed layer 104 are sequentially formed on the inner surface of the trench or through-hole 102.

The copper diffusion barrier layer 103 and the copper seed layer 104 are also extended to the surface of the interlayer film 101 outside the trench or through-hole 102 region.

Generally, a physical vapor deposition (PVD) process is used to form the copper seed layer 104 and the copper diffusion barrier layer 103.

In step 3, as shown in FIG. 1C, there is a waiting time between the formation of the copper seed layer 104 and the copper plating process in the next step. Within the waiting time range, the surface of the copper seed layer 104 may be oxidized to form copper oxide 105.

In step 4, the copper plating process is performed to fill a copper layer into the trench or through-hole 102.

The filled copper layer is also extended to the top surface of the interlayer film 101 outside the trench or through-hole 102. After step 4, the method further comprises performing a chemical mechanical grinding process to remove the copper on the top surface of the interlayer film 101 outside the trench or through-hole 102, and to planarize the surface of the copper layer at the trench or through-hole 102 region, so as to enable the surface to be flush with the top surface of the interlayer film 101.

The copper plating filling process is performed during the back end of line (BEOL) of the chip making process. The interlayer film 101 includes a plurality of layers. The copper layer filled in a trench of the interlayer film 101 is usually a metal wiring, and the copper filled in a through-hole of the interlayer film 101 is a connection structure between a metal wiring and another metal wiring or with a doped region at the next layer.

The material of the interlayer film 101 is a dielectric layer having a dielectric constant lower than that of the oxide layer or an oxide layer.

In FIG. 1C, the bottom of the interlayer film 101 is formed on the surface of a semiconductor substrate 201 such as a silicon substrate, and the metal wiring formed at the bottom of the interlayer film 101 inside the trench or through-hole 102 is connected to a doped region at bottom, such as a source or drain region or a polysilicon gate of a MOSFET, through the filled copper connection structure.

The interlayer film 101 may be one element of a series of interconnection structures from a substrate up. Each of such interlayer film is built on the layer below which is in turn formed on the previous element of the series of interconnection structures, which can be a metal wiring with the reference numeral 201 in FIG. 1A.

In FIG. 1C, as is known in the existing method, the copper plating process is performed under the condition that copper oxide 105 is formed on the surface of the copper seed layer 104, as a natural phenomenon occurring within the waiting time period. In the presence of copper oxide 105, the plating solution for the copper plating process, especially an acidic plating solution such as a sulfuric acid, can rapidly dissolve the copper seed layer 104 having copper oxide 105 formed on its surface. At the bottom corners 202 of the trench or the through-hole 102 as shown in FIG. 1C, the thickness of the copper seed layer 104 itself is relatively thin. After it is rapidly dissolved, a weak point in the copper film may be generated, which may increase the difficulty of the copper plating filling process. There is a need to solve this technical problem to provide a copper plating filling process, which can improve copper plating filling.

BRIEF SUMMARY

An embodiment of the present disclosure describes a method of copper plating and filling. The method includes the following steps. In step 1: forming a hole in a dielectric layer. In step 2: forming a copper seed layer on an inner surface of the hole. In step 3: allowing a waiting time after forming the copper seed layer and before performing a copper plating process, wherein during the waiting time, a surface of the copper seed layer is oxidized to form a copper oxide layer. In step 4: performing a reduction process on the copper oxide layer. And in step 5: filling a copper layer into the hole in the copper plating process afterwards. The copper oxide layer on the surface of the copper seed layer is reduced to copper in the reduction process, and wherein a thickness of the copper seed layers on the inner surface of the hole is uniform.

As a result, waiting time between the forming the copper seed layer and performing the copper plating process is increased.

In some examples, the method further comprises a step of forming a copper diffusion barrier layer before forming the copper seed layer in step 2, wherein the copper diffusion barrier layer is formed on the inner surface of the hole, and wherein the copper seed layer is formed on the surface of the copper diffusion barrier layer.

In some examples, the copper seed layer is formed by a physical vapor deposition process (PVD).

In some examples, the copper diffusion barrier layer is formed by a physical vapor deposition process (PVD).

In some examples, the material of the copper diffusion barrier layer includes tantalum (Ta) or tantalum nitride (TaN).

In some examples, the reduction process in step 3 is performed by using an ammonia solution.

In some examples, the copper seed layer in step 2 is also extended to a surface of the interlayer film outside the hole, and the copper layer filled in step 4 is extended to the surface of the interlayer film outside the hole. In some examples, a chemical mechanical grinding process is performed after step 5, to remove the copper layer on the surface of the interlayer film outside the hole and to planarize the copper layer in the hole be flush with the surface of the interlayer film outside the hole.

In some examples, the hole filled with the copper layer in the interlayer film serves as one element of a series of interconnection structures.

In some examples, an acidic solution is used in the copper plating process in step 4.

In some examples, the acidic solution used in the copper plating process includes sulfuric acid.

In some examples, a material of the interlayer film is an oxide layer.

In some examples, the dielectric layer has a dielectric constant lower than that of the oxide layer.

In some examples, the hole is a through-hole.

In some examples, the hole is a trench.

BRIEF DESCRIPTION OF THE DRAWINGS

The present disclosure is described in further detail below with reference to the drawings.

DETAILED DESCRIPTION OF THE DISCLOSURE

Figure 1A:
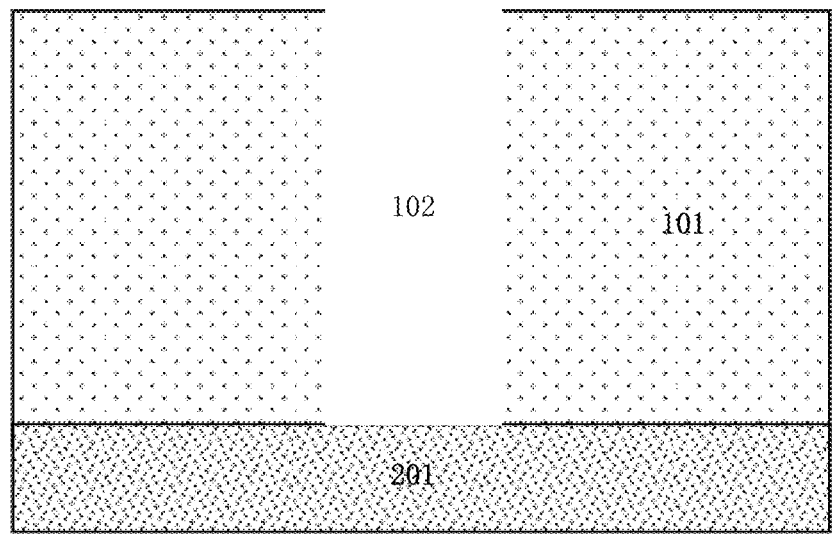
FIGS. 1A-1C show structural diagrams in each step of an existing copper plating filling process.
Figure 1B:
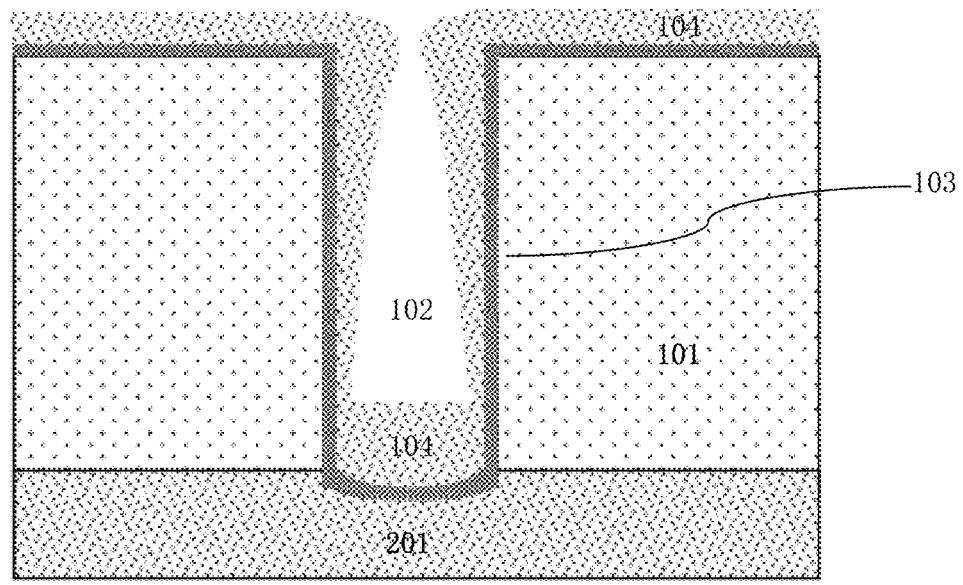
Figure 1C:
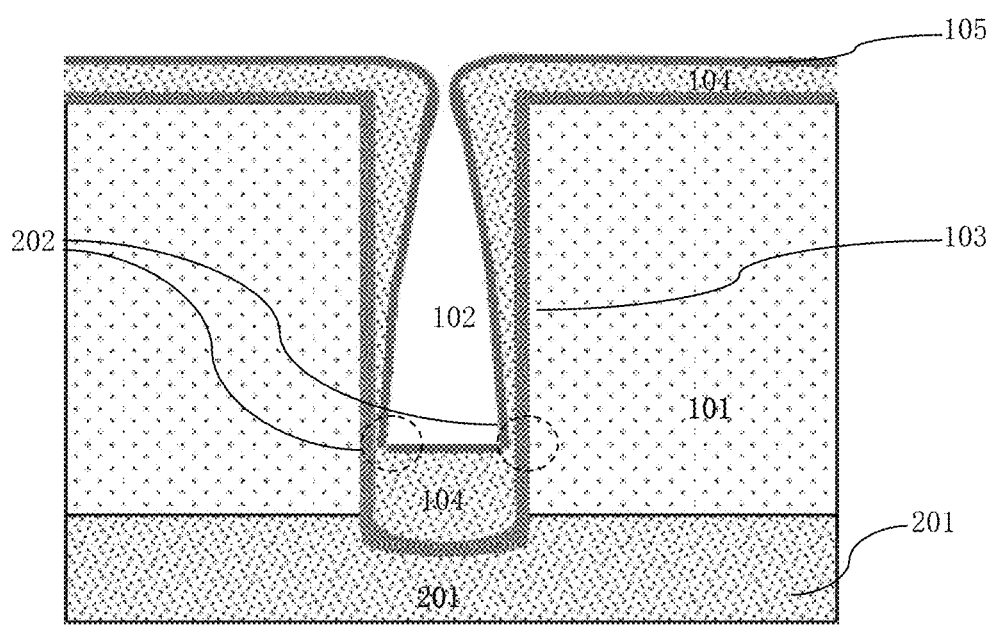
Figure 2:
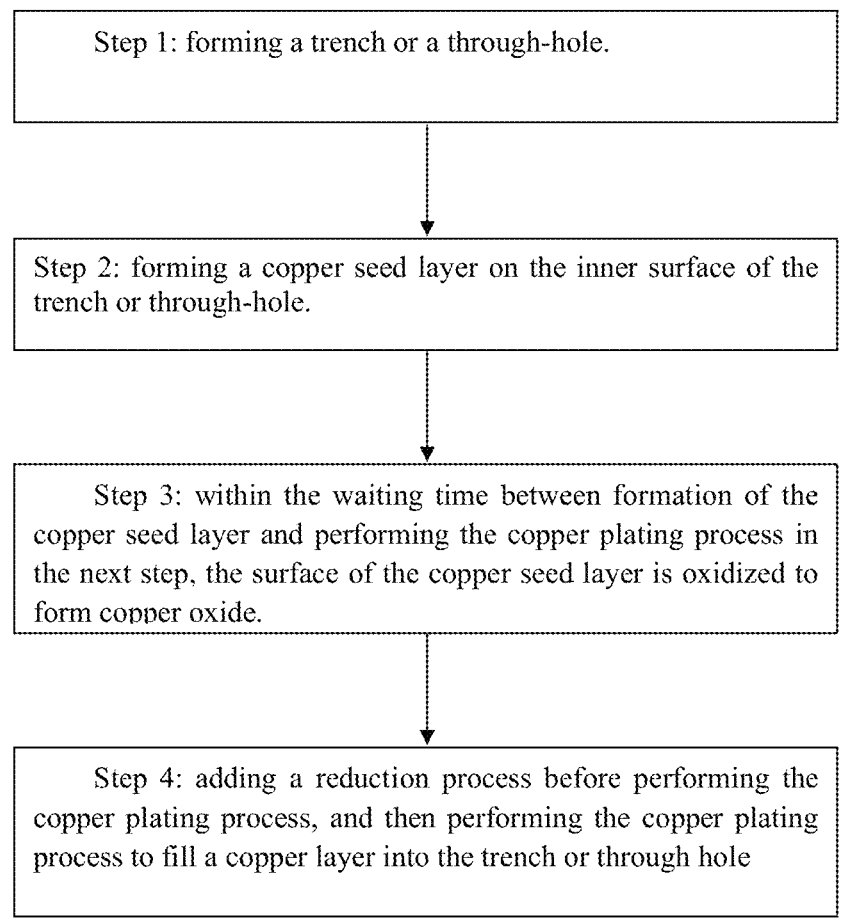
FIG. 2 is a flowchart of a copper plating filling process, according to an embodiment of the present disclosure.

FIG. 2 is a flowchart of a copper plating filling process according to an embodiment of the present disclosure. FIGS. 3A to 3D shown structure diagrams of devices in each step of the copper plating filling process according to an embodiment of the present disclosure. The plating copper filling process in the present disclosure includes the following steps.

Figure 3A:
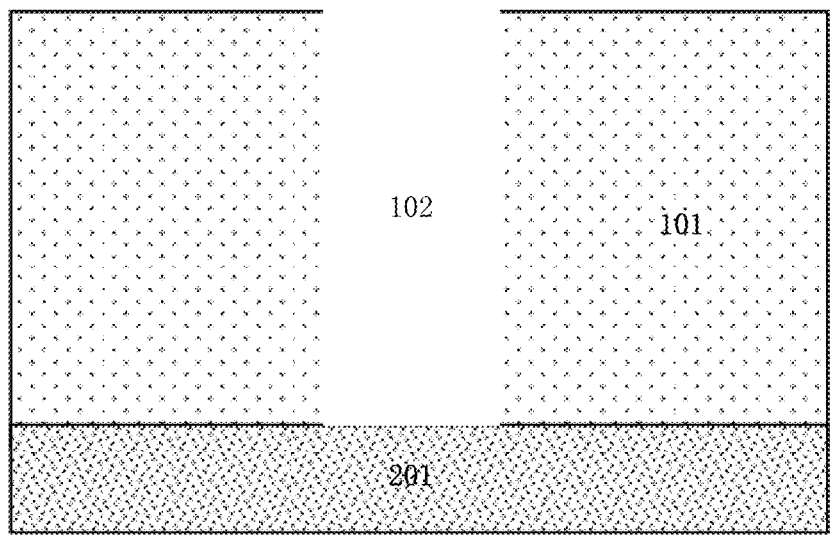
FIGS. 3A to 3D show structure diagrams in each step of the copper plating filling process, according to an embodiment of the present disclosure.

In step 1, as shown in FIG. 3A, a trench or a through-hole 102 is formed.

Preferably, the trench or through-hole 102 is formed in the interlayer film 101. In other embodiments, the trench or through-hole 102 can also be directly formed in a semiconductor substrate such as a silicon substrate.

The trench or through-hole 102 is formed by using a photolithographic definition plus etching process.

The etching process for forming the trench or through-hole 102 is dry etching.

Figure 3B:
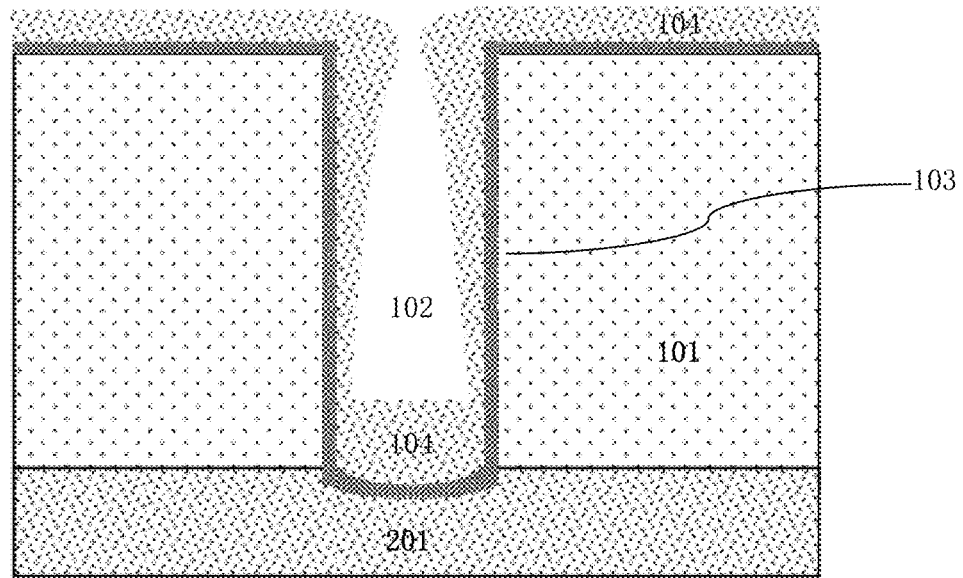

In step 2, as shown in FIG. 3B, a copper seed layer 104 is formed on the inner surface of the trench or through-hole 102.

Preferably, before forming the copper seed layer 104, a step of forming a copper diffusion barrier layer 103 is included. The copper diffusion barrier layer 103 is formed on the inner surface of the trench or through-hole 102, and the copper seed layer 104 is formed on the surface of the copper diffusion barrier layer 103.

The copper diffusion barrier layer 103 and the copper seed layer 104 are also extended to the top surface of the interlayer film 101 outside the trench or through-hole 102 region.

The copper seed layer 104 is formed by a physical vapor deposition process (PVD).

The copper diffusion barrier layer 103 is formed by another physical vapor deposition process (PVD). The material of the copper diffusion barrier layer 103 includes Ta or TaN.

Figure 3C:
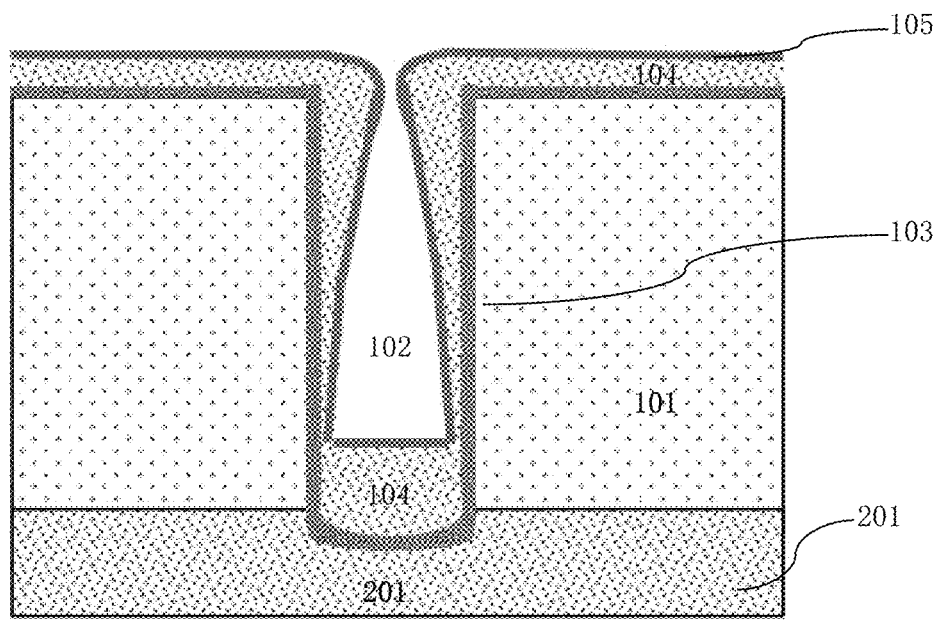

In step 3, as shown in FIG. 3C, there is a waiting time between forming the copper seed layer 104 and the copper plating in the next step, wherein within the waiting time, the surface of the copper seed layer 104 may be oxidized to form copper oxide 105.

Figure 3D:
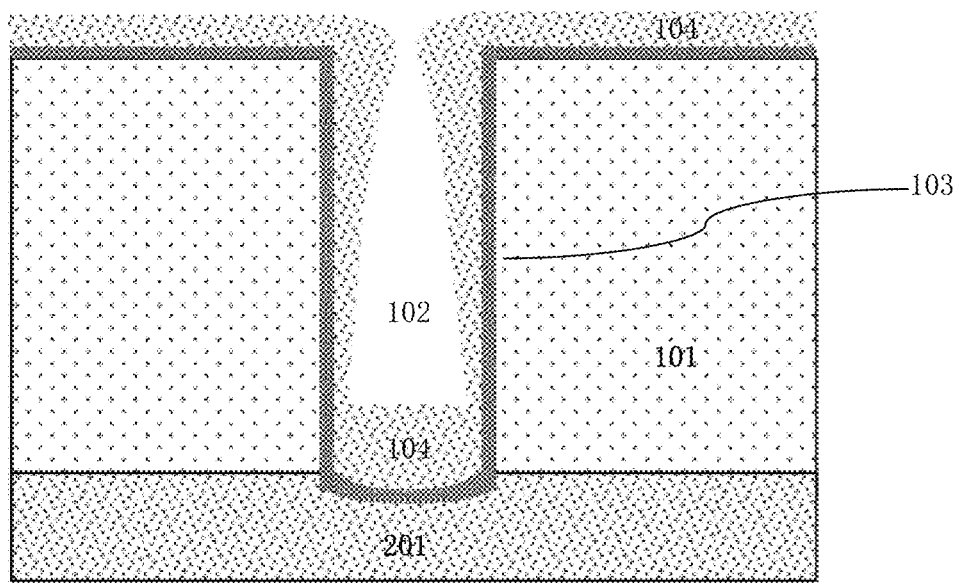

In step 4, as shown in FIG. 3D, a reduction process is introduced to reverse some of the oxidation during the waiting time, followed by the copper plating process to fill copper into the trench or through-hole 102. By applying the reduction process, the copper oxide 105 on the surface of the copper seed layer 104 is reduced back to copper, so as to eliminate the copper oxide 105 on the copper seed layer 104 during the copper plating, therefore maintaining the thicknesses of the copper seed layers 104 at various positions on the inner surface of the trench or through-hole 102.

Preferably, the reduction process is performed by applying an ammonia solution.

In the copper plating process an acidic solution is typically used. The acidic solution used in the copper plating process includes sulfuric acid. When the acidic solution is used in the copper plating process as the plating solution, the copper seed layer 104 is rapidly dissolved when the surface of the copper seed layer 104 has copper oxide 105, which may increase the difficulty of plating.

Preferably, the filled copper layer further is also extended to the surface of the interlayer film 101 outside the trench or through-hole 102, and after step 4, a chemical mechanical grinding process on the copper layer surface is performed to remove it from the surface of the interlayer film 101 outside the trench or through-hole 102, and to grind the surface of the copper layer in the trench or through-hole 102 region, so as to enable the surface to be flush with the surface of the interlayer film 101.

In the method of the embodiment of the present disclosure, the copper plating filling process belongs to Back End Of Line (BEOL) process. The interlayer film 101 includes a plurality of layers. The copper layer filled in the trench of the interlayer film 101 is used as a metal wiring, and the copper filled in the through-hole of the interlayer film 101 is a connection structure between the metal wiring and the metal wiring or doped region at the next layer.

The material of the interlayer film 101 is an oxide layer or a dielectric layer having a dielectric constant lower than that of the oxide layer.

The bottommost interlayer film 101 is formed on the surface of a semiconductor substrate such as a silicon substrate, and the metal wiring formed in the lower interlayer film is connected to a lower doped region, such as a source or drain region or a polysilicon gate of MOSFET, through the connection structure.

Each interlayer film on the consecutively lower layer is respectively formed on the previous interlayer film on which the metal wiring is formed. The reference numeral 201 in FIGS. 3A-3D refers to the metal wiring of the previous interlayer film.

According to one embodiment of the present disclosure, by adding a reduction process after the copper seed layer 104 is formed but before the copper plating process, the copper oxide 105 on the surface of the copper seed layer 104 can be reduced to copper, thus eliminating the situation where copper oxide 105 stays on the surface of the copper seed layer 104 during the copper plating process. As a result, the copper oxide 105 on the surface of the copper seed layer 104 is removed before the copper plating process starts, so the thicknesses of the copper seed layers at each point of the inner surface of the trench or through-hole 102 are maintained consistent, thereby reducing challenges for copper plating filling. For example, one of the challenges is that the plating solution in the copper plating process such as sulfuric acid rapidly dissolves the copper seed layer 104 having copper oxide 105 on its surface, with the reduction process added, the filling quality of the copper plating is improved.

In addition, the reduction process maintains the thickness of the copper seed layer 104 by removing the copper oxide 105, the Q-Time between depositing the copper seed layer 104 and performing the following copper plating process in the next step is increased, widening the Q-Time window.

The present disclosure has been described in details through specific embodiments, but the descriptions do not constitute limits on the present disclosure. Many variations and improvements can be made by those skilled in the art without departing from the principle of the present disclosure, and should also be regarded as the protection scope of the present disclosure.

What is claimed is:

1. A method for copper plating filling, comprising a plurality of steps:
   before performing step 1, providing a semiconductor substrate, comprising a series of interconnection structures each comprising a metal wire layer and a dielectric layer;
   step 1: forming a hole in the dielectric layer;
   step 2: forming a copper diffusion barrier layer on an inner surface of the hole, and forming a copper seed layer on a surface of the copper diffusion barrier layer, wherein the copper diffusion barrier layer and the copper seed layer are also disposed extending to a top surface of the dielectric layer outside the hole;
   step 3: allowing a waiting time to grow a protective copper oxide layer on a surface of the copper seed layer, and increasing the waiting time between after forming the copper seed layer and before transferring the semiconductor substrate into a plating machine to perform a copper plating process so as to widen a window of growing the protective copper oxide layer;
   step 4: performing a reduction process by applying a solution on the protective copper oxide layer following oxidation of the copper seed layer surface during the time of waiting time; and
   step 5: filling a copper plating layer on the surface of the copper seed surface into the hole and over the dielectric layer outside the hole in the copper plating process afterwards and connecting the copper filled hole in the dielectric layer to the metal wire layer;
   wherein, the protective copper oxide layer on the surface of the copper seed layer is reduced to copper in the reduction process, and wherein a thickness of the copper seed layer on the inner surface of the hole is kept uniform.

2. The method for copper plating filling according to claim 1, wherein the copper seed layer is formed by a physical vapor deposition process (PVD).

3. The method for copper plating filling according to claim 1, wherein the copper diffusion barrier layer is formed by a physical vapor deposition process (PVD).

4. The method for copper plating filling according to claim 1, wherein a material of the copper diffusion barrier layer includes tantalum (Ta) or tantalum nitride (TaN).

5. The method for copper plating filling according to claim 1, wherein the solution applied in the reduction process in step 4 is an ammonia solution.

6. The method for copper plating filling according to claim 1, wherein the dielectric layer in step 1 is an interlayer film.

7. The method for copper plating filling according to claim 6,
   wherein the copper seed layer in step 2 is also extended to a surface of the interlayer film outside the hole; and
   wherein the copper plating layer filled in step 5 is extended to the surface of the copper seed layer on the interlayer film outside the hole.

8. The method for copper plating filling according to claim 7, wherein the copper plating layer filled in the hole of the interlayer film serves as a connection structure to a doped region.

9. The method for copper plating filling according to claim 1, wherein an acidic solution is used in the copper plating process in step 5.

10. The method for copper plating filling according to claim 9, wherein the acid solution used in the copper plating process includes sulfuric acid.

11. The method for copper plating filling according to claim 8, wherein the interlayer film is an oxide layer.

12. The method for copper plating filling according to claim 8, wherein the series of interconnection structures is formed on a doped region of a surface of the semiconductor substrate.

13. The method for copper plating filling according to claim 12, wherein each of the series of interconnection structures includes the interlayer film and the hole filled copper plating layer.

14. The method for copper plating filling according to claim 12, wherein the semiconductor substrate is a silicon substrate.

15. The method for copper plating filling according to claim 1, wherein the hole is a through-hole.

16. The method for copper plating filling according to claim 1, wherein the hole is a trench.

17. The method for copper plating filling according to claim 11, wherein a dielectric constant of the dielectric layer is lower than a dielectric constant of silicon oxide.

\* \* \* \* \*